US012676621B2

(12) United States Patent
    Santiccioli et al.

(10) Patent No.: US 12,676,621 B2
(45) Date of Patent: Jul. 7, 2026

(54) SIGNAL OSCILLATION CIRCUIT WITH ADAPTIVE TUNING FOR TAIL FILTERS

(71) Applicant: QUALCOMM Incorporated, San Diego, CA (US)

(72) Inventors: Alessio Santiccioli, San Diego, CA (US); Mario Mercandelli, Carlsbad, CA (US); Giovanni Marucci, San Diego, CA (US); Dongmin Park, San Diego, CA (US); Yiwu Tang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 20 days.

(21) Appl. No.: 18/604,828

(22) Filed: Mar. 14, 2024

(65) Prior Publication Data

US 2025/0293695 A1     Sep. 18, 2025

(51) Int. Cl.
    H03L 7/093      (2006.01)
    H03L 7/089      (2006.01)
    H03L 7/097      (2006.01)
(52) U.S. Cl.
    CPC ............ H03L 7/093 (2013.01); H03L 7/0891 (2013.01); H03L 7/097 (2013.01)
(58) Field of Classification Search
    CPC .. H03B 5/1212; H03B 5/1215; H03B 5/1228; H03B 2200/009; H03B 5/1243; H03B 2200/0062; H03B 2200/006; H03B 2200/0088; H03L 7/099; H03L 7/08; H03L 7/06; H03L 7/00
    See application file for complete search history.

(56) References Cited

U.S. PATENT DOCUMENTS

| | | | | |
|---|---|---|---|---|
| 6,331,830 | B1 * | 12/2001 | Song | H03M 1/1057 |
| | | | | 341/120 |
| 7,142,062 | B2 * | 11/2006 | Vaananen | H03L 7/087 |
| | | | | 331/25 |
| 10,381,981 | B2 * | 8/2019 | Moslehi Bajestan | H03L 7/093 |
| 10,749,468 | B1 * | 8/2020 | Park | H10D 1/20 |
| 2008/0284530 | A1 | 11/2008 | Pellerano et al. | |
| 2018/0375472 | A1 | 12/2018 | Valdes-Garcia et al. | |
| 2019/0089302 | A1 | 3/2019 | Moslehi Bajestan et al. | |
| 2019/0158022 | A1 | 5/2019 | Issakov et al. | |

OTHER PUBLICATIONS

Bhat A., et al., A Tail-Resonance Calibration Technique for Wide Tuning Range LC VCOs, IEEE International Symposium on Circuits and Systems (ISCAS), May 2016, pp. 2070-2073.

(Continued)

*Primary Examiner* — Diana J. Cheng
(74) *Attorney, Agent, or Firm* — Gerald P. Joyce, III

(57)     ABSTRACT

Techniques and apparatus for oscillating signal generation using a signal oscillation circuit capable of adaptively tuning one or more tail filters. An example signal oscillation circuit generally includes a voltage-controlled oscillator (VCO) that includes a VCO core and a first tail filter coupled to the VCO core, the first tail filter including a tunable component, a logic circuit including a first output coupled to a control input of the tunable component of the first tail filter, and a first signal converter including an input coupled to a second output of the logic circuit and including an output coupled to a node of the VCO.

20 Claims, 10 Drawing Sheets

(56) References Cited

OTHER PUBLICATIONS

Ferriss M., et al., "A Gradient Descent Bias Optimizer for Oscillator Phase Noise Reduction Demonstrated in 45nm and 32nm SOI CMOS", IEEE Radio Frequency Integrated Circuits Symposium, Jun. 2018, pp. 344-347.
International Search Report and Written Opinion—PCT/US2025/019563—ISA/EPO—Jul. 3, 2025.

* cited by examiner

600

900

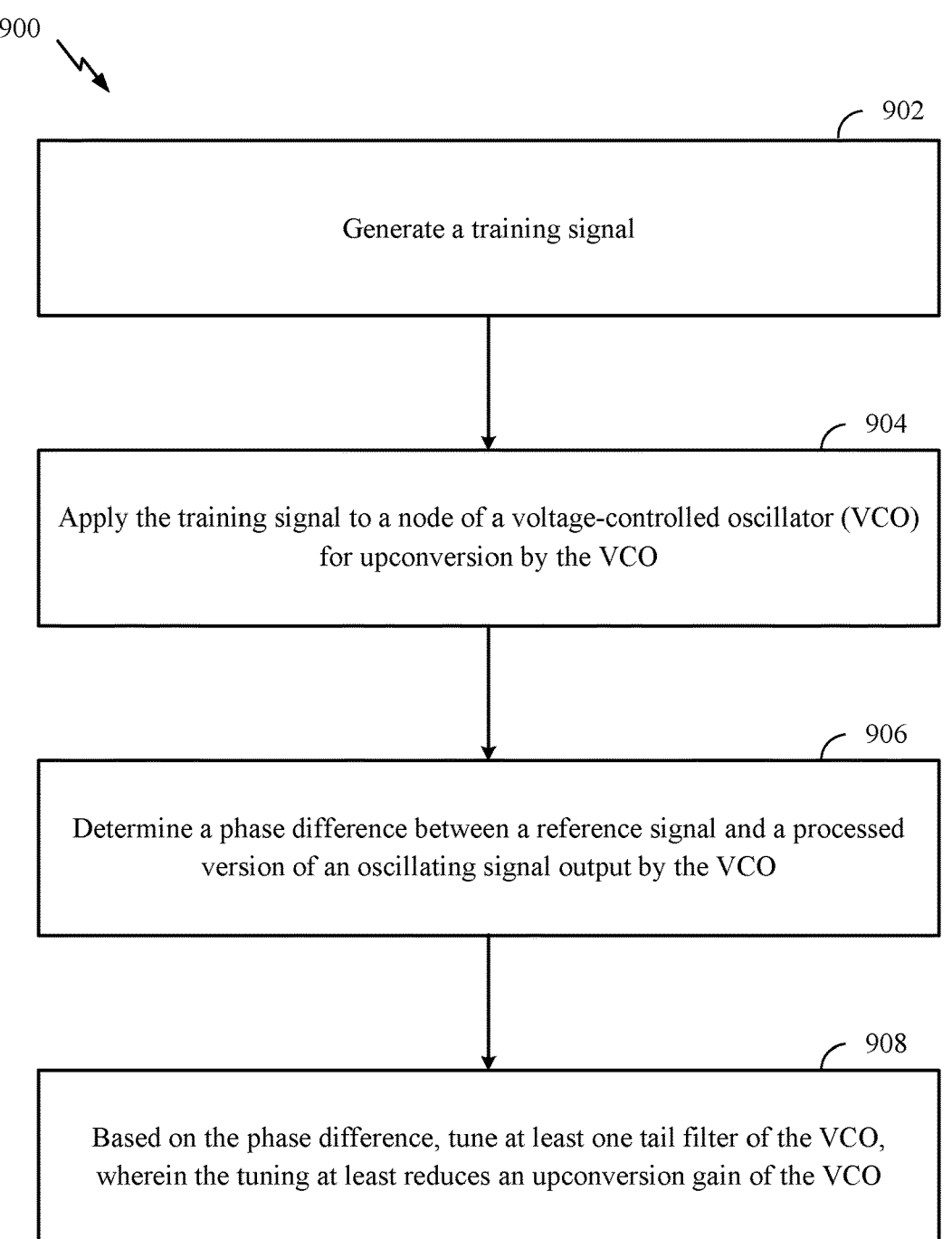

902

Generate a training signal

904

Apply the training signal to a node of a voltage-controlled oscillator (VCO) for upconversion by the VCO

906

Determine a phase difference between a reference signal and a processed version of an oscillating signal output by the VCO

908

Based on the phase difference, tune at least one tail filter of the VCO, wherein the tuning at least reduces an upconversion gain of the VCO

FIG. 9

SIGNAL OSCILLATION CIRCUIT WITH ADAPTIVE TUNING FOR TAIL FILTERS

TECHNICAL FIELD

Certain aspects of the present disclosure generally relate to electronic circuits and, more particularly, to techniques and apparatus for adaptively tuning one or more tail filters in a signal oscillation circuit.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include at least one phase-locked loop (PLL), which may be used, for example, in a frequency synthesizer to generate and control a local oscillator (LO) signal for mixing with a baseband signal (or a radio frequency (RF) signal) for upconversion (or downconversion) to an intermediate frequency (IF) signal or an RF signal (or an IF signal or a baseband signal) before transmission (after reception). The frequency synthesizer may include a voltage-controlled oscillator (VCO) for tuning an oscillating signal to different frequencies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a signal oscillation circuit. The signal oscillation circuit generally includes a voltage-controlled oscillator (VCO) that includes a VCO core and a first tail filter coupled to the VCO core, the first tail filter including a tunable component, a logic circuit including a first output coupled to a control input of the tunable component of the first tail filter, and a first signal converter including an input coupled to a second output of the logic circuit and including an output coupled to a node of the VCO.

Certain aspects of the present disclosure are directed to a method of oscillating signal generation. The method generally includes generating a training signal, applying the training signal to a node of a VCO for upconversion by the VCO, determining a phase difference between a reference signal and a processed version of an oscillating signal output by the VCO, and based on the phase difference, tuning at least one tail filter of the VCO. Tuning the at least one tail filter of the VCO at least reduces an upconversion gain of the training signal.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 9 is a flow diagram of example operations for oscillating signal generation, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide techniques and apparatus for adaptively tuning one or more tail filters in a signal oscillation circuit. Such a signal oscillation circuit may include a variable-frequency oscillator (e.g., a voltage-controlled oscillator (VCO) or a digitally controlled oscillator (DCO)) and logic circuitry. The logic circuitry may be configured to generate a training signal for applying to a node of the variable-frequency oscillator, effectively determine an upconversion gain of the training signal, and tune at least one tail filter of the variable-frequency oscillator to minimize (or at least reduce) the upconversion gain of the variable-frequency oscillator. In this manner, the flicker noise (also referred to as "1/f noise") upconversion of the variable-frequency oscillator may be at least reduced, thereby reducing the phase noise of the oscillator.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
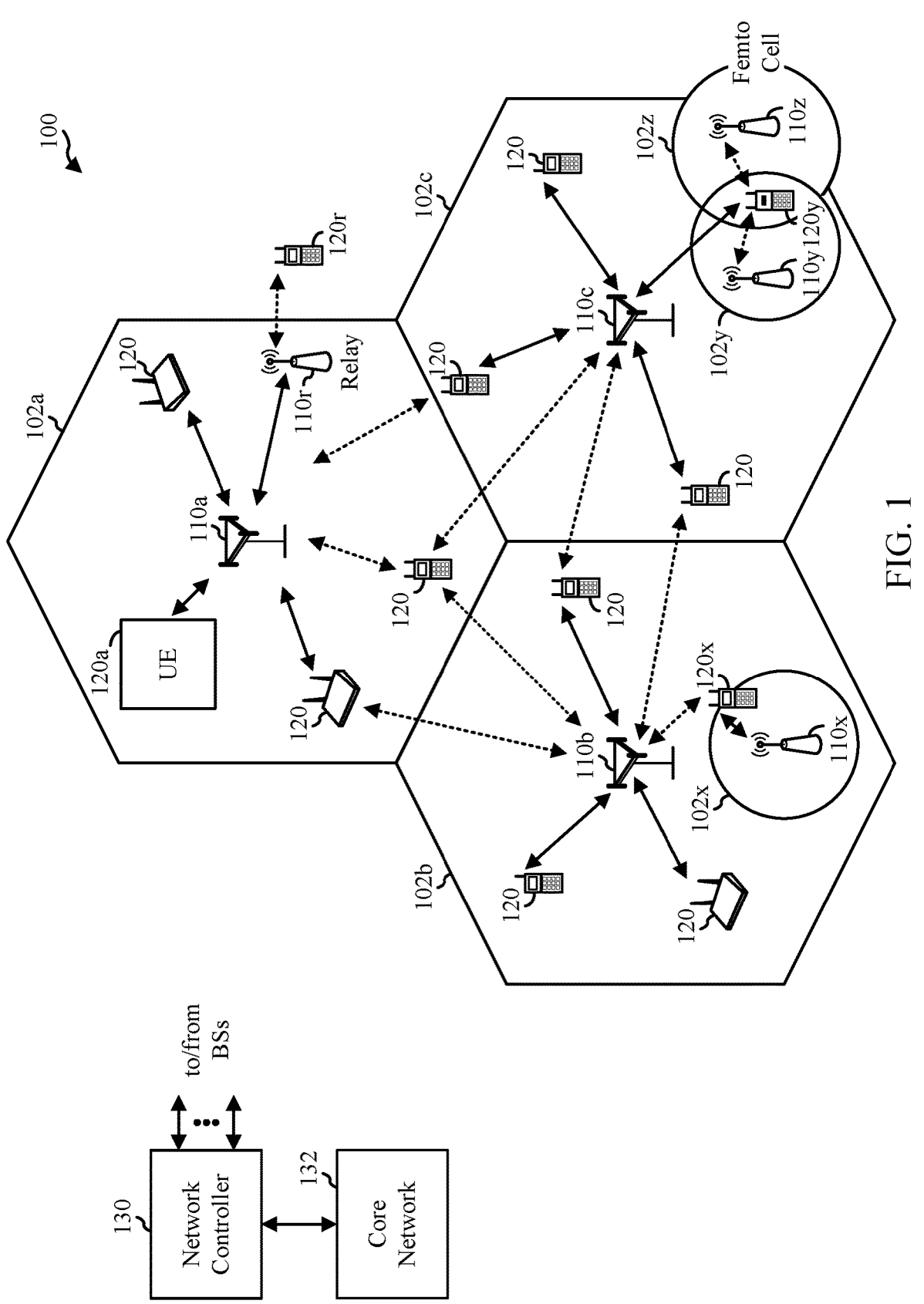
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, an augmented reality device, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include at least one signal oscillation circuit capable of at least reducing 1/f noise upconversion by a variable-frequency oscillator (e.g., a VCO or a DCO) included in the at least one signal oscillation circuit, as described in more detail herein.

Figure 2:
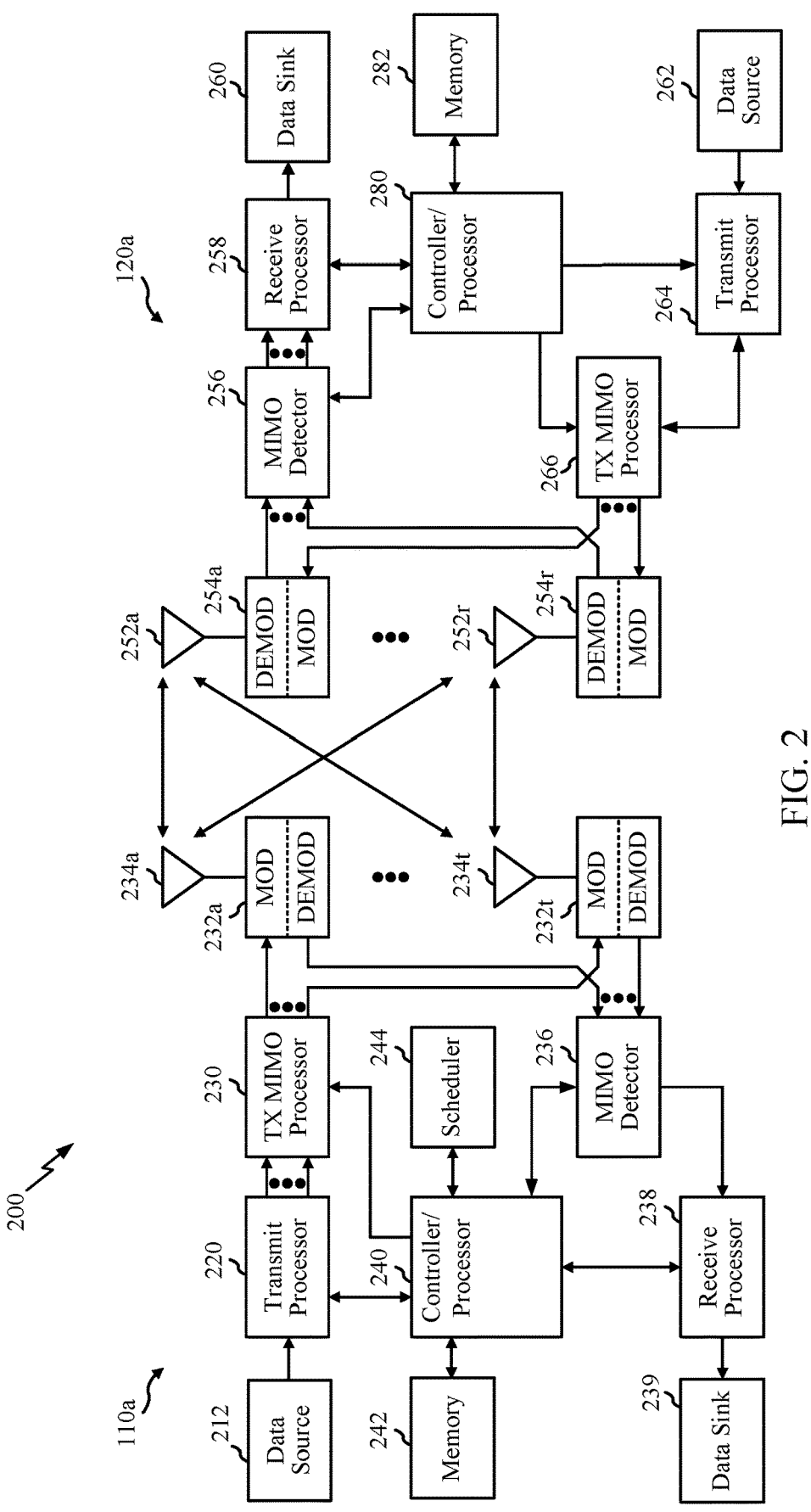
FIG. 2 is a block diagram conceptually illustrating a design of an example a base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include at least one signal oscillation circuit capable of at least reducing 1/f noise upconversion by a variable-frequency oscillator (e.g., a VCO or a DCO) included in the at least one signal oscillation circuit, as described in more detail herein.

Example RF Transceiver

Figure 3:
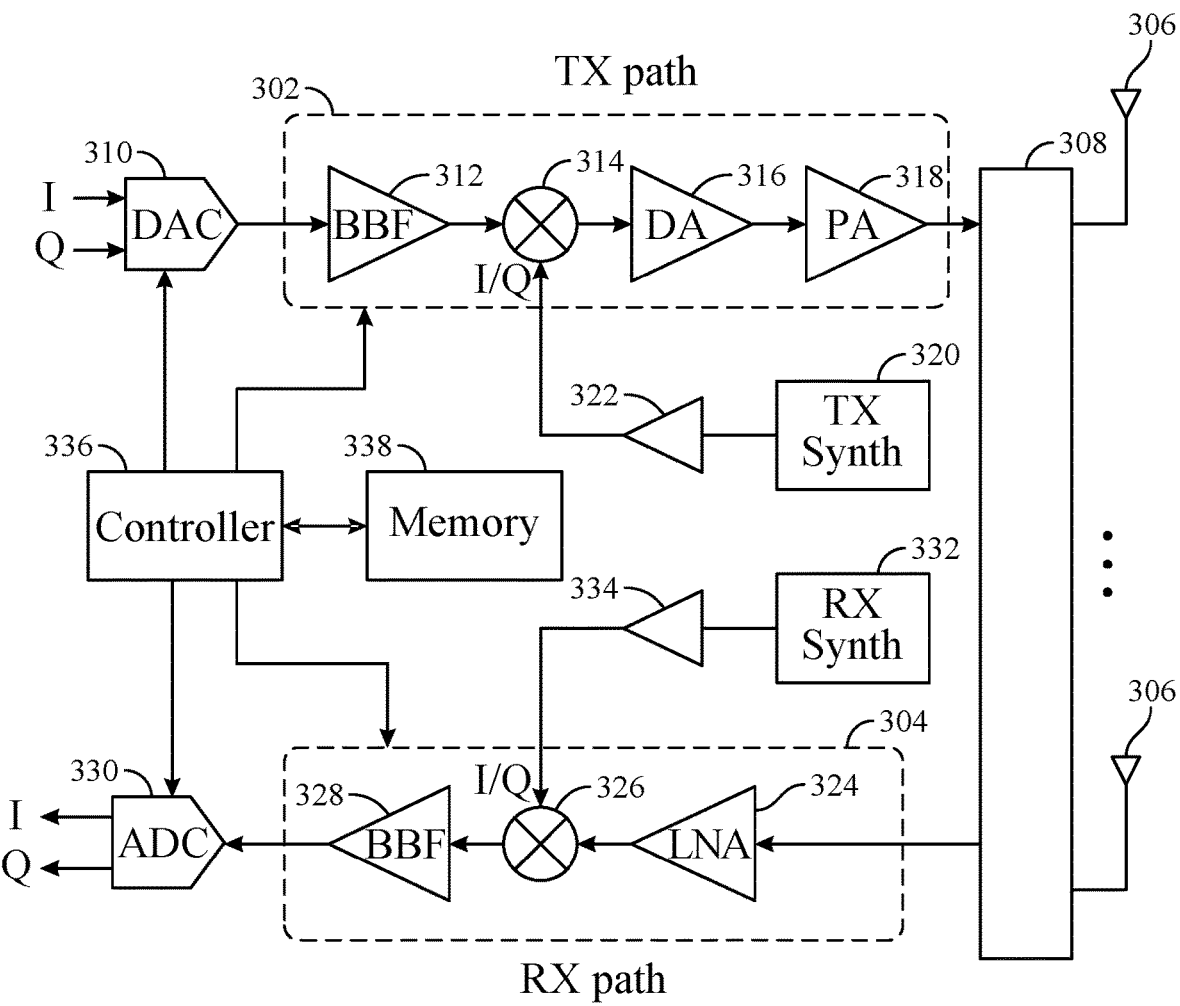
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a VCO or a DCO) to generate a stable, tunable LO with a particular tuning range. Thus, the transmit LO may be produced by a TX frequency synthesizer 320 with a transmit phase-locked loop (TxPLL). The transmit LO may be buffered or amplified by amplifier 322 before being mixed with the baseband signals in the mixer 314. Similarly, the receive LO may be produced by an RX frequency synthesizer 332 with a receive phase-locked loop (RxPLL). The receive LO may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer. For certain aspects, the RxPLL and/or the TxPLL may be part of a signal oscillation circuit capable of minimizing, or at least reducing, 1/f noise upconversion by a variable-frequency oscillator (e.g., a VCO or a DCO) included in the at least one signal oscillation circuit, as described in more detail herein.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for signal oscillation circuits in any of various other suitable systems (e.g., video monitors, microprocessors, high-speed serializer/deserializer (SerDes) systems, or other electronic systems).

Example Phase-Locked Loop

Figure 4:
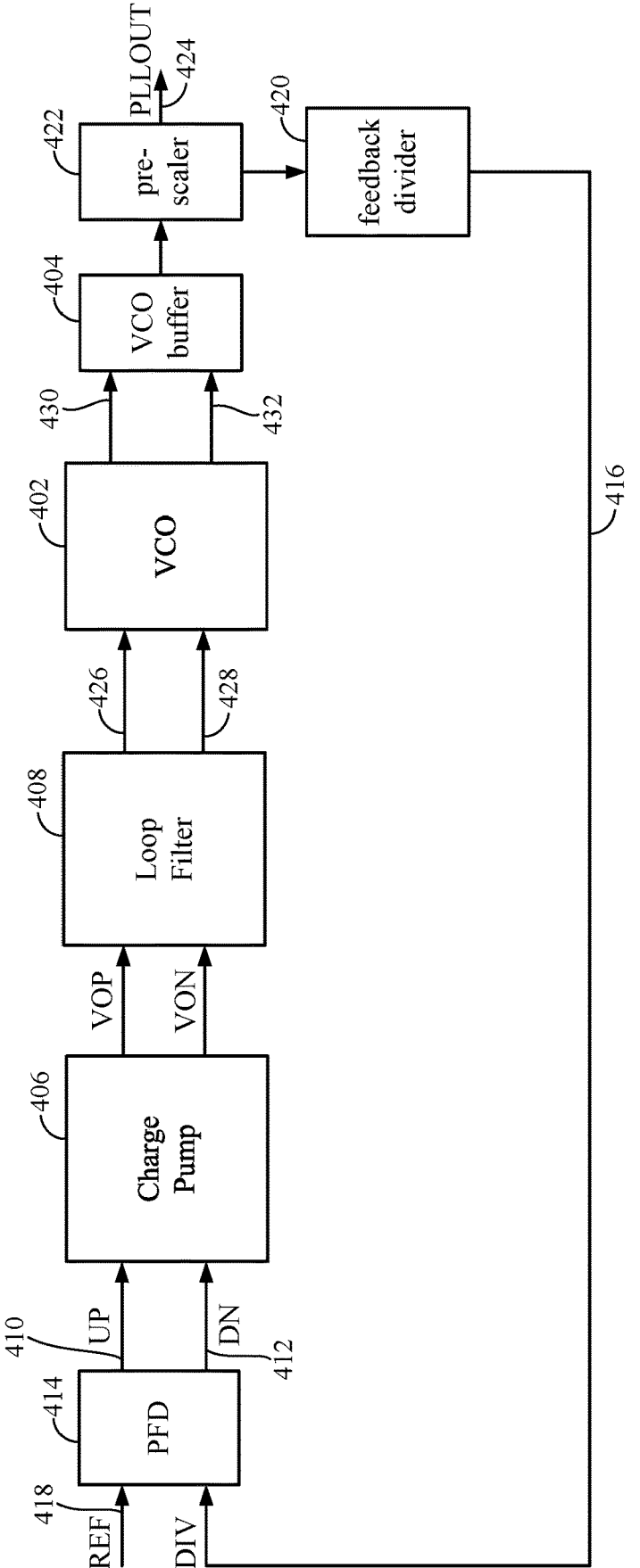
FIG. 4 is a block diagram of an example phase-locked loop (PLL), in which aspects of the present disclosure may be practiced.

FIG. 4 is a block diagram of an example phase-locked loop (PLL) 400, in which aspects of the present disclosure may be practiced. The PLL 400 may be utilized in a frequency synthesizer, such as a TxPLL in the TX frequency synthesizer 320 or a RxPLL in the RX frequency synthesizer 332 of FIG. 3.

As illustrated in FIG. 4, a charge pump 406 may be coupled to a low-pass loop filter 408 (also referred to as a "charge pump filter" or "PLL loop filter") and may provide a control voltage (also referred to as a "tuning voltage" or "Vtune") to a VCO 402, where the control voltage is used to adjust an oscillation frequency of the VCO 402. The charge pump 406 and the VCO 402 may receive power via two power supply rails: a positive supply rail and a negative supply rail. Switches in the charge pump 406 may be controlled by up/down pulse signals 410, 412 (labeled "UP" and "DN"), and the loop filter 408 may reject the high frequency transient signals from this switching activity. These up/down pulse signals 410, 412 may be generated by a phase frequency detector (PFD) 414, which may compare a feedback signal 416 (based on an output or processed output of the VCO 402 and labeled "DIV") to a reference frequency signal 418 (labeled "REF"). In some aspects, as illustrated in FIG. 4, the feedback signal 416 may be generated by buffering the output of the VCO 402 with a VCO buffer 404, scaling the buffered signal in a pre-scaler 422 to generate the PLL's output signal 424 (labeled "PLL-OUT"), and frequency dividing an output of the pre-scaler 422 in a feedback divider 420.

In some aspects, as illustrated in FIG. 4, the input control voltage for the VCO 402 may be provided by the charge pump 406 and filtered by the low-pass loop filter 408 as VCO control inputs 426, 428. A resonant tank circuit of the VCO 402 may generate, at differential VCO outputs 430, 432, an oscillating signal having a specific frequency (e.g., determined by a voltage at the VCO control inputs 426, 428), which may be input to the VCO buffer 404. The VCO buffer 404 may be coupled to the differential VCO outputs 430, 432 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 430, 432.

Although the PLL 400 is implemented as a differential circuit in FIG. 4, it is to be understood that the PLL may also alternatively be implemented as a single-ended circuit.
Example Voltage-Controlled Oscillators Modern communication systems may rely on low phase noise to obtain high signal-to-noise ratio (SNR) in both receive and transmit paths (e.g., RX and TX paths 304, 302). Phase noise is the frequency-domain representation of random fluctuations in the phase of a waveform, such as the oscillating signal produced by a VCO. Whereas an ideal oscillator would generate a pure sine wave, real oscillators have phase-modulated noise components that spread the power of the oscillating signal to adjacent frequencies, resulting in noise sidebands. Oscillator phase noise may include low frequency flicker noise and white noise. Flicker noise is a type of electronic noise having a 1/f power density spectrum, and although flicker noise appears as a low-frequency phenomenon, this low-frequency noise can be upconverted to frequencies close to the carrier frequency, which results in oscillator phase noise. What is more, the flicker noise (and hence, the phase noise) may increase as complementary metal-oxide-semiconductor (CMOS) processes scale (e.g., to deep sub-micron technologies and beyond).

Figure 5:
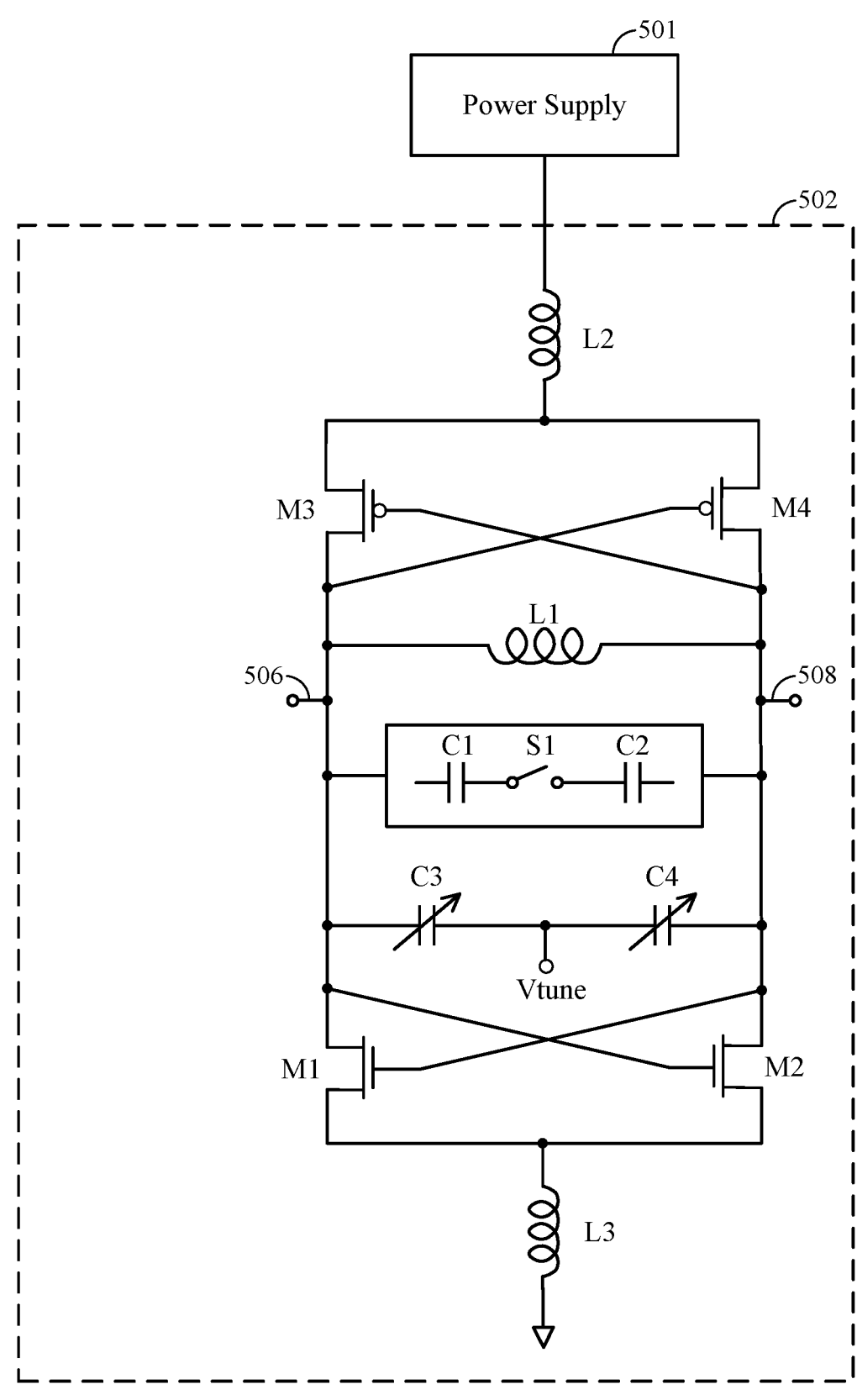
FIG. 5 is a schematic diagram of an example voltage-controlled oscillator (VCO), in accordance with certain aspects of the present disclosure.

FIG. 5 is a schematic diagram of an example VCO 502 with a complementary VCO core, in accordance with certain aspects of the present disclosure. The VCO 502 may receive power from a power supply 501 with a power supply voltage (e.g., Vdd) referenced to a reference potential node 510 (e.g., electrical ground). The VCO 502 may have differential output nodes 506 and 508 for outputting an oscillating signal when power is supplied to the VCO 502. As illustrated, the VCO 502 includes a resonant circuit (also referred to as an inductor-capacitor (LC) circuit, a tank circuit, or a tuned circuit). The VCO 502 also includes a pair of cross-coupled n-type transistors M1 and M2 that form an n-type active negative transconductance (−g$_m$) circuit. Additionally, the VCO 502 includes a pair of cross-coupled p-type transistors M3 and M4 that form a p-type active negative transconductance circuit. The cross-coupled transistors serve to cancel out the loss (due to parasitics) of the resonant circuit and, thus, to sustain the oscillating mechanism of the VCO 502. The VCO core, which includes the cross-coupled transistors and the resonant circuit, is referred to as a complementary VCO core because the VCO core includes both p-type and n-type cross-coupled transistors. In certain aspects, the VCO 502 may include a VCO core with only n-type cross-coupled transistors or only p-type cross-coupled transistors, instead of a complementary VCO core.

The resonant circuit may include an inductor L1 (which may be a center-tapped inductor or may alternatively be implemented as two or more series inductors) and a capacitor network (e.g., comprising capacitors C1 and C2) designed to oscillate in a certain resonant frequency range. The inductor L1 may also be referred to as a "main LC tank inductor." The inductor L1 and/or one or more capacitors (and/or varactors, such as C3 and C4) in the capacitor network may be variable to adjust the VCO frequency within a tuning range. For certain aspects, the resonant circuit may include one or more switches (e.g., represented by switch S1 in FIG. 5) used to select different combinations of capacitors (and/or varactors) in the capacitor network.

The VCO 502 also includes two common-mode (CM) inductors L2 and L3. The CM inductor L2 may be a positive-side (p-side) inductor, and the CM inductor L3 may be a negative-side (n-side) inductor. The CM inductors L2 and L3 are coupled to the sources of the cross-coupled transistors (also referred to as "virtual nodes" for the CM inductors) and may provide second-order harmonic high impedance for VCO phase noise reduction when resonating with capacitive elements, which may be parasitic, explicit, or a combination thereof. In other words, the CM inductors L2 and L3 may help mitigate the problem of VCO phase noise.

In certain aspects, the CM inductors L2 and L3 may each be replaced by a tail filter, and each tail filter may include one or more passive elements (e.g., a capacitive element and/or an inductive element). In some aspects, at least one of the passive elements may be tunable in each tail filter (e.g., as in tail filters 712, 716 in FIGS. 8A and 8B, described below). The tunable elements included in the tail filters may be tuned in an effort to reduce flicker noise upconversion, which reduces VCO phase noise at low frequency offsets. For example, one or more capacitive elements (e.g., in a switched capacitor array) included in a tail filter may be controlled using a digital signal to tune the capacitance of the capacitive element(s) and hence the impact of the tail filter.

Figure 6:
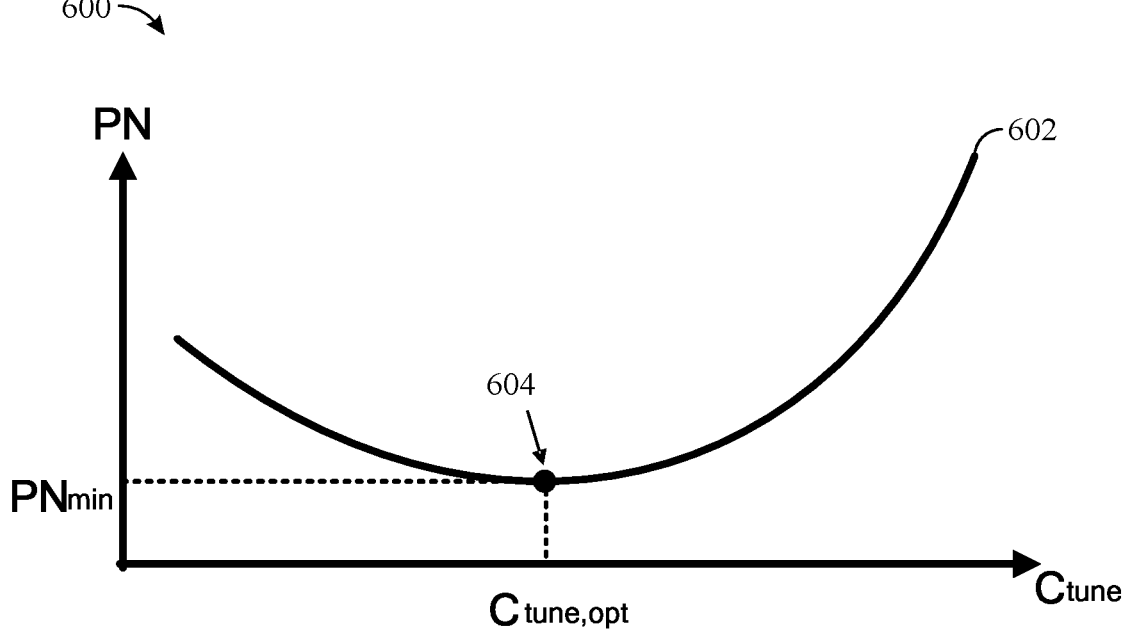
FIG. 6 is an example graph of VCO phase noise versus tunable tail filter capacitance settings, in accordance with certain aspects of the present disclosure.

FIG. 6 is an example graph 600 of phase noise (labeled "PN") of a VCO (e.g., VCO 402, 502) versus a tunable tail filter capacitance setting (labeled "Ctune"), in accordance with certain aspects of the present disclosure. The relationship between the VCO phase noise and the tail filter capacitance setting is represented by curve 602. As shown, the phase noise is minimized (e.g., PNmin) at the optimal tail filter setting (labeled "Ctune,opt") at point 604 on the curve 602. At point 604, the flicker noise upconversion in the VCO is minimized, and hence, the VCO phase noise may also be minimized.

Figure 7:
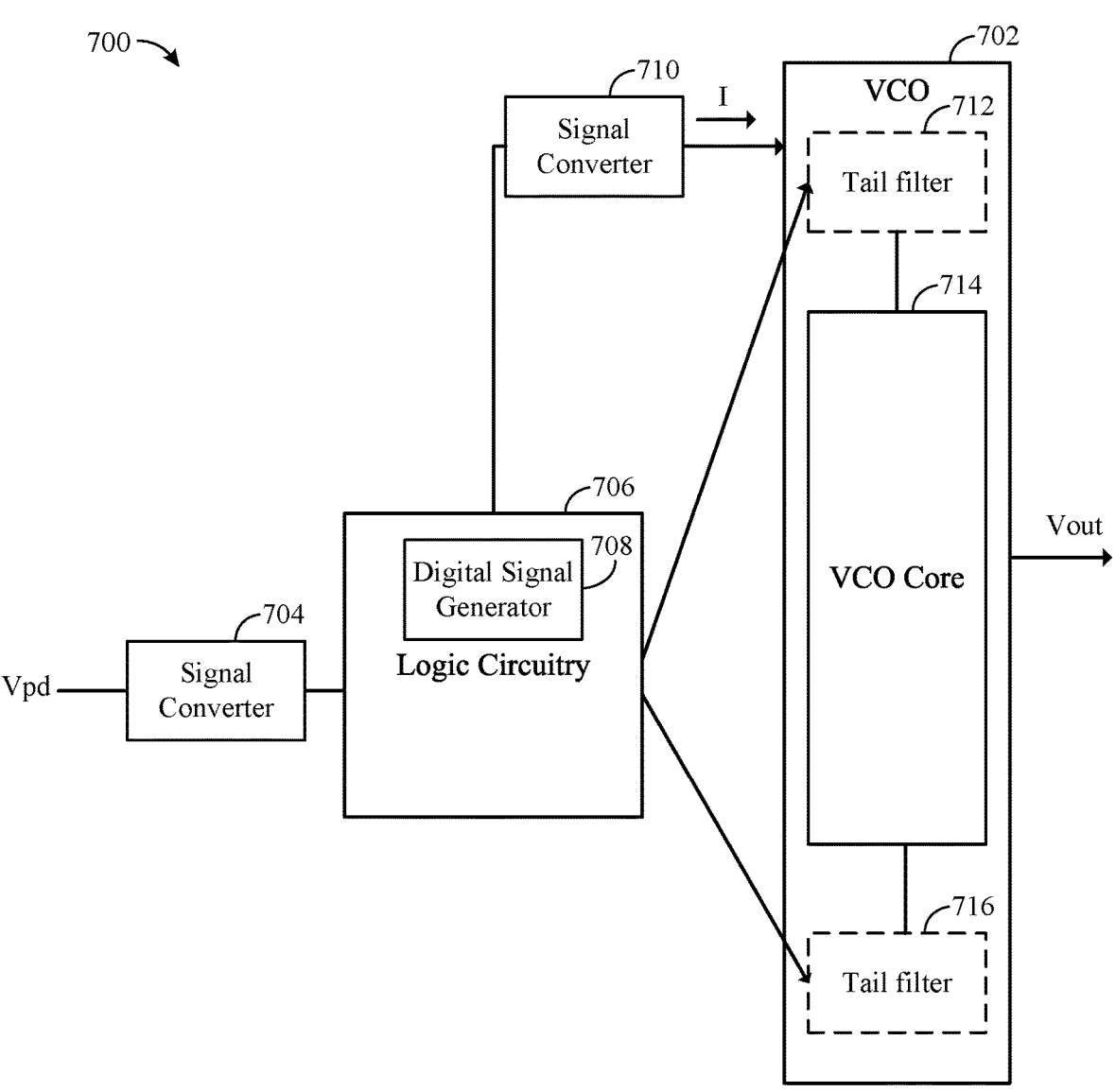
FIG. 7 is a block diagram of an example signal oscillation circuit with adaptive tuning for at least one tail filter, in accordance with certain aspects of the present disclosure.

The optimal tail filter setting (Ctune,opt) for tail filters of a variable-frequency oscillator may be derived through performing manual sweeps of the tail filter settings (e.g., a Ctune sweep). However, optimal tail filter settings vary widely across frequency bands and across process, voltage, and temperature (PVT) conditions. As a result, manual sweeping of the tail filter settings across multiple frequency bands and multiple PVT conditions can be lengthy and costly, and even then, the derived tail filter settings may at times be sub-optimal. While it is possible to perform automatic testing of tail filters included in a variable-frequency oscillator during part screening, the testing is often far too time intensive and expensive to be practicable. Accordingly, certain aspects of the present disclosure provide for a signal oscillation circuit with low-power and low-area automatic adaptive tail filter tuning to minimize, or at least reduce, variable-frequency oscillator flicker noise upconversion and, hence, phase noise.
Example Signal Oscillation Circuit with Adaptive Tuning FIG. 7 is a block diagram of an example signal oscillation circuit 700 with adaptive tuning, in accordance with certain aspects of the present disclosure. The signal oscillation circuit 700 may include a VCO 702, logic circuitry 706, and a signal converter 710. In certain aspects, the signal oscillation circuit 700 may also include a signal converter 704.

Figure 8A:
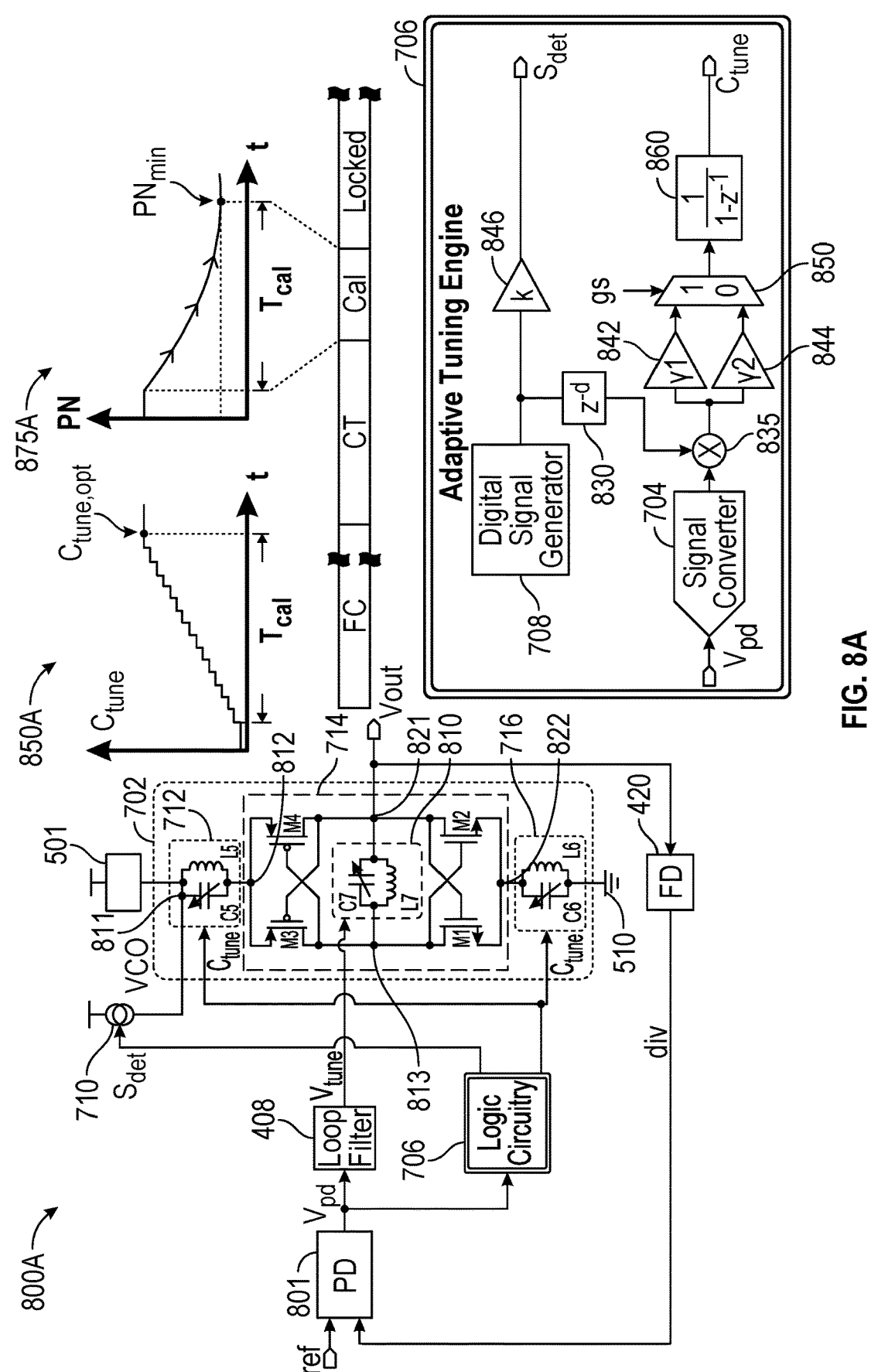
FIGS. 8A and 8B are circuit diagrams of example signal oscillation circuits with adaptive tail filter tuning, in accordance with certain aspects of the present disclosure.
Figure 8B:
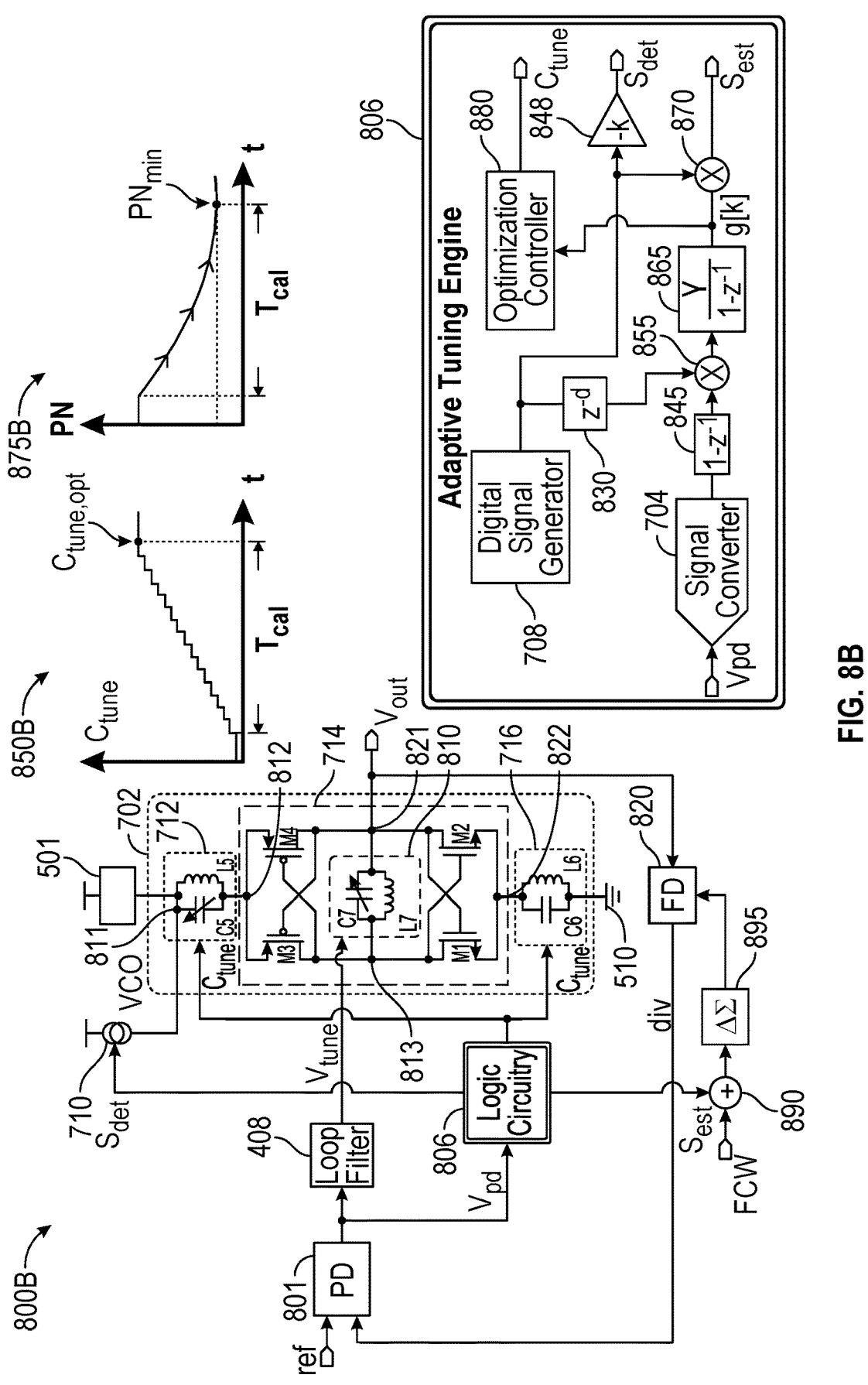

The VCO 702 may include a VCO core 714 and one or more tail filters 712, 716 coupled to the VCO core 714, as shown. The VCO core 714 may be a complementary VCO core with cross-coupled p-type and n-type transistors (e.g., as illustrated in FIG. 5). Each of the tail filters 712, 716 may include one or more tunable components (e.g., tunable capacitive elements, as shown in FIGS. 8A and 8B, and/or tunable inductive components). The VCO 702 may have at least one output voltage node (labeled "Vout") (e.g., output nodes 506, 508), which may be coupled to drains of the cross-coupled transistors in the VCO core 714.

The signal oscillation circuit 700 may receive an input (labeled "$V_{pd}$") from a phase detector (e.g., the PFD 414 of FIG. 4) (e.g., in an analog PLL) or from a time-to-digital converter (TDC) (not shown) after the phase detector (e.g., in a digital PLL). The input to the signal oscillation circuit 700 may be coupled to an input of the signal converter 704 or to an input of the logic circuitry if the signal converter 704 is omitted. In cases where the signal converter 704 is present, an output of the signal converter 704 may be coupled to an input of the logic circuitry 706. The signal converter 704 may be implemented as an analog-to-digital converter (ADC) (e.g., in an analog PLL) or as a time-to-digital converter (TDC) (e.g., in a digital PLL). The ADC may be a one-bit ADC (e.g., a comparator) or a multi-bit ADC. The logic circuitry 706 (which may also be referred to herein as an "adaptive tuning engine") may include at least one output coupled to at least one control input of the tunable component(s) of the tail filter 712 and/or to at least one control input of the tunable component(s) of the second tail filter 716.

The signal converter 710 may include an input coupled to an output of the logic circuitry 706 and an output (e.g., for outputting a current signal labeled "I") coupled to a node of the VCO 702. The signal converter 710 may be implemented as a digital-to-analog converter (DAC) and/or a variable current source. In certain aspects, the logic circuitry 706 may include a digital signal generator 708 (also referred to as a "training waveform generator"). The digital signal generator 708 may have an output coupled to an input of the signal converter 710 via an output of the logic circuitry 706. The digital signal generator 708 may be configured to output a digital square wave or any other digitized waveform shape to the signal converter 710.

The logic circuitry 706 may be configured to generate a deterministic training signal using the digital signal generator 708, and the training signal may be applied to and upconverted by the VCO 702, just as the flicker noise is upconverted by the VCO 702. The logic circuitry 706 may be configured to receive a phase difference between a reference signal and the output of the VCO 702 (or a processed version thereof), convert the phase difference using the signal converter 704, and adaptively tune the setting(s) of at least one tail filter 712, 716 of the VCO 702 to minimize (or at least reduce) the upconversion of the training signal (and the upconversion gain of the VCO 702) based on the output of the signal converter 704. In this manner, the logic circuitry 706 may be configured to minimize (or at least reduce) the flicker noise upconversion in the VCO 702 in addition to the upconversion of the training signal. As a result, the VCO phase noise may be minimized, or at least reduced.

FIGS. 8A and 8B are circuit diagrams of example signal oscillation circuits 800A, 800B, respectively, with adaptive tail filter tuning, in accordance with certain aspects of the present disclosure.

The signal oscillation circuit 800A may include a phase detector (PD) 801, the loop filter 408, the logic circuitry 706, the power supply 501, the VCO 702, the signal converter

710 (illustrated as an adjustable current source), and the feedback divider 420 (labeled "FD"). In certain aspects, the PD 801 may be implemented by the PFD 414 and the charge pump 406 of FIG. 4, for example. The one or more tail filters 712, 716 may each include one or more passive elements (e.g., a capacitive element C5, C6 and/or an inductive element L5, L6). In this case, the capacitive elements may be tunable, as shown, and may receive a control signal Ctune from the logic circuitry 706. The VCO core 714 may include transistors M1, M2, M3, and M4, described above with respect to FIG. 5. The VCO core 714 may also include a resonant circuit, such as the inductor L1 and the capacitor network (comprising capacitors C1-C4) from FIG. 5, implemented and shown together as a tunable resonant circuit 810 (which is represented by inductor L7 and tunable capacitor C7). The VCO 702 may be coupled to the reference potential node 510, as shown.

In certain aspects, the signal oscillation circuit 800A may include an analog PLL. In these aspects, the signal converter 704 may be implemented as an analog-to-digital converter (ADC) (e.g., a 1-bit ADC (i.e., a comparator) or a multi-bit ADC). The PD 801 may include a first input coupled to a reference node (labeled "ref"), a second input (labeled "div") coupled to the output voltage node of the VCO 702 (e.g., via the feedback divider 420), and an output (labeled "Vpd") coupled to an input of the signal converter 704. The loop filter 408 may include an input coupled to an output of the PD 801 and an output coupled to a control input of the VCO core 714 (e.g., a Vtune signal coupled to the tunable resonant circuit 810 for controlling the oscillating frequency of the VCO 702).

The logic circuitry 706 may include the signal converter 704 and the digital signal generator 708. Although the signal converter 704 is shown as being internal to the logic circuitry 706, the signal converter 704 may also be external to the logic circuitry 706. The logic circuitry 706 may also include a delay element 830 (labeled "$z^{-d}$"), a correlator 835, a digital gain component 842 (labeled "γ1"), a digital gain component 844 (labeled "γ2"), a digital gain component 846 (labeled "k"), a multiplexer (MUX) 850, and an accumulator 860 (labeled "$1/1-z^{-1}$").

The delay element 830 may include an input coupled to the output of the digital signal generator 708, as shown. The correlator 835 may include a first input coupled to an output of the signal converter 704 and a second input coupled to an output of the delay element 830. The digital gain component 842 may include an input coupled to an output of the correlator 835 and have a first gain (e.g., γ1). The digital gain component 844 may include an input coupled to the output of the correlator 835 and have a second gain (e.g., γ2) different than the first gain. The MUX 850 may include a first input coupled to an output of the digital gain component 842 and a second input coupled to an output of the digital gain component 844, as shown. The accumulator 860 may include an input coupled to an output of the MUX 850 and an output coupled to the control inputs of the tail filters 712, 716 via one or more outputs of the logic circuitry 706. The digital gain component 846 may provide a digital gain (e.g., k) and may include an input coupled to the output of the digital signal generator 708 and an output coupled to the signal converter 710 via an output of the logic circuitry 706.

The digital signal generator 708 may be configured to generate a deterministic digital signal (e.g., a training signal, labeled "$S_{det}$"). The deterministic signal may be a digital square wave or any of other various suitable waveform shapes. The deterministic signal may be boosted by the digital gain component 846 and output by the logic circuitry 706 to the signal converter 710. The signal converter 710 (which may be implemented by a DAC as described above), may be configured to apply an analog version of the deterministic signal to a node of the VCO 702 as a current or a voltage signal. The output of the signal converter 710 may be coupled to any suitable node in the VCO 702. For example, the output of the signal converter 710 may be coupled to any of nodes 811, 812, 813, 821, or 822. The analog version of the deterministic signal may be upconverted by the VCO 702 in a manner similar to the upconversion of the flicker noise by the VCO 702.

The VCO 702 may output an oscillating signal (which includes the upconverted deterministic signal) at the output voltage node (Vout). The frequency of the oscillating signal output by the VCO 702 may be divided down by the feedback divider 420 (e.g., to lower the frequency of the oscillating signal for comparison to a reference) and routed to the PD 801. The PD 801 may be configured to determine a phase difference (labeled "$V_{pd}$") between a reference signal (labeled "ref") and a processed version of the oscillating signal output by the VCO 702 (e.g., the oscillating signal buffered by the buffer 404, scaled by pre-scaler 422, and/or frequency divided by the feedback divider 420).

The phase difference may be digitized by the signal converter 704 (e.g., which may be implemented as a 1-bit ADC). The deterministic signal generated by the digital signal generator 708 may be routed to the delay element 830, and the delay element 830 may be configured to apply a discrete time delay to the deterministic signal. The discrete time delay applied may be configured to mimic the time delay that the deterministic signal undergoes by being routed through the VCO 702, the feedback divider 420, the PD 801, and the signal converter 704, such that the generated deterministic signal received by the correlator 835 and the digitized phase difference received by the correlator 835 are matched in time. The correlator 835, which may be implemented at least in part by a multiplier, may receive the delayed deterministic signal and the digitized phase difference and may be configured to extract an estimate of the upconversion gain of the deterministic signal by the VCO 702.

The extracted estimate of the upconversion gain of the deterministic signal may be boosted by the digital gain component 842 and the digital gain component 844 and then routed to the MUX 850, which may be used to effectively implement a gear shifting method according to the control signal (labeled "gs"). In the gear shifting method, the MUX 850 may be configured to initially select the digital gain component 842 and output the γ1-boosted signal output by the digital gain component 842 to the accumulator 860 for accumulating. The MUX 850 may be configured to switch inputs and select the γ2-boosted output from the digital gain component 844 based on a timer dependent on the configuration of the VCO 702. In some aspects, the gain of the digital gain component 842 may be higher than the gain of the digital gain component 844.

The accumulator 860 may be configured to accumulate the signal boosted by the digital gain component 844 (e.g., to eliminate variance that may be present and help achieve a more stable steady state tuning signal output from the logic circuitry 706). The accumulator 860 may be configured to output the tuning signal (labeled "Ctune") to a control input of one or more of the tail filters 712, 716 to minimize (or at least reduce) the upconversion of the deterministic signal by the VCO 702. When the output of the accumulator 860 has stabilized, the optimal tail filter setting(s) (e.g., Ctune,opt) have been applied, and the upconversion of the deterministic signal has been minimized, or at least reduced. By minimizing (or at least reducing) the upconversion of the deterministic signal, the upconversion of the flicker noise by the VCO 702 may also be minimized (or at least reduced), resulting in less VCO phase noise.

As shown in the graph 850A, the tuning signal output by the accumulator 860 (shown here as an idealistic Ctune signal) may tune the tail filters 712, 716 over a calibration time (labeled "Tcal") until the optimized tail filter setting(s) (labeled "Ctune,opt") are derived. In certain aspects, the calibration of the tail filter setting(s) using the signal oscillation circuit 800A may be completed in about one microsecond (μs). The corresponding optimization (or at least reduction) of the phase noise (PN) over the same period of time is shown in the graph 875A.

In certain aspects, a single tuning signal output by the logic circuitry 706 may control both tail filters 712, 716. In other aspects, different tuning signal outputs may control each of the tail filters 712, 716.

The calibration phase of the tail filters 712, 716 may be initialized and completed during initial bring-up of the signal oscillation circuit 800A. For example, the signal oscillation circuit 800A may undergo in succession a fast charge phase (labeled "FC"), a coarse tuning phase (labeled "CT"), a calibration phase (labeled "Cal"), and a locked phase (e.g., labeled "locked," where the PLL of the signal oscillation circuit 800A may be phase-locked). The logic circuitry 706 may be activated for the duration of the calibration phase and may be turned off during the fast charge phase, the coarse tuning phase, and the locked phase.

In certain aspects, the signal oscillation circuit 800A may include a digital PLL. In these aspects, the signal converter 704 may be implemented as a time-to-digital converter (TDC) (or the PFD and CP combination may be replaced by a TDC), the loop filter 408 may be replaced by a digital loop filter, and the VCO 702 may be replaced by a DCO. In these aspects, the inputs of the signal converter 704 may be coupled to the inputs of the PD 801, or the signal converter 704 may be omitted, in which case the correlator 835 may be coupled to an output of the TDC and the digital loop filter may include an input coupled to the output of the TDC. Furthermore, the DCO may include a DAC (not shown) and a VCO. The DAC may include an input coupled to an output of the digital loop filter and an output coupled to a control input of the VCO core 714.

The signal oscillation circuit 800B may be similar to the signal oscillation circuit 800A, but the logic circuitry 706 may be replaced by logic circuitry 806, the feedback divider 420 may be replaced by a feedback divider 820, and the signal oscillation circuit 800B may further include a combiner 890 (e.g., implemented as an adder) and a delta-sigma modulator 895 (e.g., labeled "Δ2"). As such, most everything discussed herein with respect to the signal oscillation circuit 800A also applies to the signal oscillation circuit 800B. The combiner 890 may include a first input configured to receive a frequency control word (FCW) for the signal oscillation circuit 800B and a second input coupled to an output of the logic circuitry 806 and configured to receive an estimated signal (labeled "$S_{est}$") from the logic circuitry. The delta-sigma modulator 895 may include an input coupled to an output of the combiner 890 and an output coupled to an input of the feedback divider 820, as shown.

The logic circuitry 806 may include the signal converter 704, the digital signal generator 708, the delay element 830, an optional differentiator 845, a correlator 855, an accumulator 865 (labeled "γ/1−z⁻¹"), a multiplier 870, a digital gain component 848 (labeled "−k"), and an optimization controller 880. The optional differentiator 845 may be coupled between an output of the signal converter 704 and a first input of the correlator 855. A second input of the correlator 855 may be coupled to an output of the delay element 830. The accumulator 865 may include an input coupled to an output of the correlator 855, a first output coupled to a first input of the multiplier 870, and a second output coupled to the optimization controller 880. In certain aspects, the first and second outputs of the accumulator 865 may be the same output. The multiplier 870 may include a second input coupled to the output of the digital signal generator 708. The output of the digital signal generator 708 may also be coupled to an input of the digital gain component 848, and the output of the digital gain component may be coupled to the input of the signal converter 710 via an output of the logic circuitry 806.

As described above, the digital signal generator 708 may be configured to generate the deterministic signal. The deterministic signal may be boosted based on a gain of the digital gain component 848 and output by the logic circuitry 806 to the signal converter 710. The deterministic signal generated by the digital signal generator 708 may also be routed to the delay element 830. The deterministic signal output by the signal converter 710 may then be applied to a node of the VCO 702, upconverted by the VCO 702, output by the VCO 702 at the Vout node in the oscillating signal, frequency divided down by the feedback divider 820, and routed to the PD 801. Also as described above, the PD 801 may be configured to determine a phase difference (labeled "$V_{pd}$") between the reference signal and a processed version of the oscillating signal output by the VCO 702. The phase difference may then be digitized by the signal converter 704. The correlator 855, which may be implemented by a multiplier, may receive the delayed deterministic signal and the digitized phase difference (which may have passed through the optional differentiator 845), and may be configured to extract an estimate of the upconversion gain of the deterministic signal by the VCO 702.

The extracted estimate of the upconversion gain of the deterministic signal may be accumulated by the accumulator 865 to produce an output (labeled "g[k]"). The output of the accumulator 865 may be provided to the multiplier 870 and the optimization controller 880. The multiplier 870 may be configured to multiply the output of the accumulator 865 by the generated deterministic signal to form an estimation signal (labeled "$S_{est}$"). The estimation signal may be similar to the deterministic signal and, thus, may be a digital square wave or any of other various suitable waveform shapes. The logic circuitry 806 may be configured to output the estimation signal from the multiplier 870 to the combiner 890. The combiner 890 may add the estimation signal to the FCW and output the result through the delta-sigma modulator 895 to the feedback divider 820. The signal output by the delta-sigma modulator 895 may have an inverted sign compared to the upconverted deterministic signal.

When the output of the accumulator 860 (which is constantly updated by the logic circuitry 806 based on the received phase difference determined by the PD 801) has stabilized, the upconversion gain of the deterministic signal ($S_{det}$) may be matched at least in part by the upconversion gain of the estimation signal ($S_{est}$). The output of the accumulator 865 then provides an estimate of the upconversion gain of the deterministic signal ($S_{det}$), which may be utilized by the optimization controller 880 to perform a search (e.g., a simple linear search, a binary search, or a steepest descent search) of the tail filter 712, 716 settings to determine the optimal setting(s) for the tail filters 712, 716

(e.g., the settings that produce the minimum flicker noise upconversion and result in the minimal amount of VCO phase noise).

As shown in the graph 850B, the tuning signal output by the optimization controller 880 (shown here as an idealistic Ctune signal) may tune the tail filters 712, 716 over a calibration time (labeled "Tcal") until the optimized tail filter setting(s) (labeled "Ctune, opt") are derived. In certain aspects, the calibration of the tail filter setting(s) using the signal oscillation circuit 800B may be completed in about 6 μs. The corresponding optimization of the VCO phase noise over the same period of time is shown in the graph 875B.

Example Operations for Oscillating Signal Generation

FIG. 9 is a flow diagram of example operations 900 for wireless communication, in accordance with certain aspects of the present disclosure. The operations 900 may be performed, for example, by a signal oscillation circuit (e.g., the signal oscillation circuit 700, 800A, 800B of FIGS. 7, 8A, and 8B, respectively).

The operations 900 may include, at block 902, generating a training signal (e.g., an analog version of the digital training signal $S_{det}$). The training signal may be a current or voltage signal, such as a square wave current or voltage signal.

At block 904, the operations 900 may include applying the training signal to a node (e.g., node 811, 812, 813, 821, or 822) of a VCO (e.g., VCO 702) for upconversion by the VCO. In this manner, the training signal may be upconverted by the VCO in a similar manner (e.g., in the same upconversion pathway in the VCO) as 1/f noise.

At block 906, the operations 900 may include determining a phase difference (e.g., $V_{pd}$) between a reference signal (e.g., ref) and a processed version (e.g., div) of an oscillating signal (Vout) output by the VCO. The oscillating signal may include or at least represent the upconverted training signal.

At block 908, the operations 900 may include tuning at least one tail filter of the VCO (e.g., tail filter 712, 716) based on the phase difference. The tuning may at least reduce an upconversion gain of the VCO (by reducing upconversion of the training signal). In this manner, the phase noise of the VCO may also be decreased.

According to certain aspects, generating the training signal at block 902 includes generating a digital training signal and converting the digital training signal to an analog training signal for the applying at block 904. In this case, the tuning at block 908 may involve converting the phase difference to a digital representation of the phase difference (e.g., via the signal converter 704), delaying the digital training signal to generate a delayed digital training signal (e.g., with the delay element 830), correlating the delayed digital training signal with the digital representation of the phase difference to generate a correlation (e.g., with the correlator 835), and tuning the at least one tail filter of the VCO based on the correlation. Converting the phase difference to the digital representation of the phase difference may involve using a 1-bit analog-to-digital converter (ADC) or a multi-bit ADC.

According to certain aspects, the training signal is a current signal. In this case, the applying at block 904 may include applying the current signal with a variable current source (e.g., as illustrated by the signal converter 710 in FIG. 8A).

EXAMPLE ASPECTS

In addition to the various aspects described above, specific combinations of aspects are within the scope of the present disclosure, some of which are detailed below:

Aspect 1: A signal oscillation circuit comprising: a voltage-controlled oscillator (VCO) that includes a VCO core and a first tail filter coupled to the VCO core, the first tail filter including a tunable component; a logic circuit including a first output coupled to a control input of the tunable component of the first tail filter; and a first signal converter including an input coupled to a second output of the logic circuit and including an output coupled to a node of the VCO.

Aspect 2: The signal oscillation circuit of Aspect 1, further comprising a second signal converter including an output coupled to an input of the logic circuit.

Aspect 3: The signal oscillation circuit of Aspect 2, wherein the signal oscillation circuit comprises an analog phase-locked loop and wherein the second signal converter comprises an analog-to-digital converter (ADC).

Aspect 4: The signal oscillation circuit of Aspect 3, further comprising: a phase detector including a first input coupled to a reference node and including a second input coupled to an output of the VCO; and a loop filter including an input coupled to an output of the phase detector and including an output coupled to a control input of the VCO core, wherein the output of the phase detector is further coupled to an input of the ADC.

Aspect 5: The signal oscillation circuit of Aspect 3 or 4, wherein the ADC is a 1-bit ADC.

Aspect 6: The signal oscillation circuit according to any of Aspects 2-5, wherein the signal oscillation circuit comprises a digital phase-locked loop and wherein the second signal converter comprises a time-to-digital converter (TDC).

Aspect 7: The signal oscillation circuit of Aspect 6, further comprising: a phase detector including a first input coupled to a reference node and including a second input coupled to an output of the VCO, wherein an input of the TDC is coupled to an output of the phase detector; a digital loop filter including an input coupled to an output of the TDC; and a digital-to-analog converter (DAC) including an input coupled to an output of the digital loop filter and including an output coupled to a control input of the VCO core, wherein the output of the TDC is further coupled to the input of the logic circuit.

Aspect 8: The signal oscillation circuit according to any of Aspects 1-7, wherein the first signal converter comprises a digital-to-analog converter (DAC).

Aspect 9: The signal oscillation circuit according to any of Aspects 1-8, wherein the first signal converter comprises a variable current source.

Aspect 10: The signal oscillation circuit according to any of Aspects 1-9, wherein the VCO core is a complementary VCO core, wherein the VCO further comprises a second tail filter coupled to the complementary VCO core, wherein the second tail filter comprises a tunable component, and wherein the first output of the logic circuit is further coupled to a control input of the tunable component of the second tail filter.

Aspect 11: The signal oscillation circuit according to any of Aspects 1-10, wherein the VCO core is a complementary VCO core, wherein the VCO further comprises a second tail filter coupled to the complementary VCO core, wherein the second tail filter comprises a tunable component, and wherein a third output of the logic circuit is coupled to a control input of the tunable component of the second tail filter.

Aspect 12: The signal oscillation circuit according to any of Aspects 1-11, wherein the logic circuit comprises a digital signal generator including an output coupled to the input of the first signal converter.

Aspect 13: The signal oscillation circuit of Aspect 12, wherein the digital signal generator is configured to output a digital square wave.

Aspect 14: The signal oscillation circuit of Aspect 12 or 13, wherein the logic circuit further comprises: a delay element having an input coupled to the output of the digital signal generator; a correlator including a first input coupled to an input of the logic circuit and including a second input coupled to an output of the delay element; a first digital gain component including an input coupled to an output of the correlator and having a first gain; a second digital gain component including an input coupled to the output of the correlator and having a second gain different than the first gain; a multiplexer including a first input coupled to an output of the first digital gain component and including a second input coupled to an output of the second digital gain component; and an accumulator including an input coupled to an output of the multiplexer and including an output coupled to the first output of the logic circuit.

Aspect 15: The signal oscillation circuit of Aspect 14, wherein the logic circuit further comprises a third digital gain component including an input coupled to the output of the digital signal generator and including an output coupled to the second output of the logic circuit.

Aspect 16: A method of oscillating signal generation, the method comprising: generating a training signal; applying the training signal to a node of a voltage-controlled oscillator (VCO) for upconversion by the VCO; determining a phase difference between a reference signal and a processed version of an oscillating signal output by the VCO; and based on the phase difference, tuning at least one tail filter of the VCO, wherein the tuning at least reduces an upconversion gain of the VCO.

Aspect 17: The method of Aspect 16, wherein the training signal comprises a square wave current signal.

Aspect 18: The method of Aspect 16 or 17, wherein: generating the training signal comprises: generating a digital training signal; and converting the digital training signal to an analog training signal for the applying; and the tuning comprises: converting the phase difference to a digital representation of the phase difference; delaying the digital training signal to generate a delayed digital training signal; correlating the delayed digital training signal with the digital representation of the phase difference to generate a correlation; and tuning the at least one tail filter of the VCO based on the correlation.

Aspect 19: The method of Aspect 18, wherein converting the phase difference to the digital representation of the phase difference comprises using a 1-bit analog-to-digital converter (ADC).

Aspect 20: The method according to any of Aspects 16-19, wherein the training signal comprises a current signal and wherein the applying comprises applying the current signal with a variable current source.

ADDITIONAL CONSIDERATIONS

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A signal oscillation circuit comprising:
   a voltage-controlled oscillator (VCO) comprising:
      a VCO core with a tunable resonant circuit; and
      a first tail filter coupled to the VCO core, the first tail filter including a tunable component;
   a logic circuit including a first output coupled to a control input of the tunable component of the first tail filter;
   a first signal converter including an input coupled to a second output of the logic circuit and including an output coupled to a node of the VCO; and
   a second signal converter including an output coupled to an input of the logic circuit, wherein the second signal converter comprises an analog-to-digital converter (ADC) or a time-to-digital converter (TDC).

2. The signal oscillation circuit of claim 1, further comprising a phase detector including an output coupled to the tunable resonant circuit and to an input of the second signal converter.

3. The signal oscillation circuit of claim 2, wherein the signal oscillation circuit comprises an analog phase-locked loop and wherein the third second signal converter comprises the ADC.

4. The signal oscillation circuit of claim 3, further comprising a loop filter, wherein:
   the phase detector includes a first input coupled to a reference node and includes a second input coupled to an output of the VCO;
   the loop filter includes an input coupled to the output of the phase detector and includes an output coupled to a control input of the VCO core; and
   the output of the phase detector is further coupled to an input of the ADC.

5. The signal oscillation circuit of claim 3, wherein the ADC is a 1-bit ADC.

6. The signal oscillation circuit of claim 2, wherein the signal oscillation circuit comprises a digital phase-locked loop and wherein the third second signal converter comprises the TDC.

7. The signal oscillation circuit of claim 6, further comprising:
   a digital loop filter including an input coupled to an output of the TDC; and
   a digital-to-analog converter (DAC) including an input coupled to an output of the digital loop filter and including an output coupled to a control input of the VCO core, wherein the output of the TDC is further coupled to the input of the logic circuit, wherein an input of the TDC is coupled to the output of the phase detector, and wherein the phase detector includes a first input coupled to a reference node and includes a second input coupled to an output of the VCO.

8. The signal oscillation circuit of claim 1, wherein the first signal converter comprises a digital-to-analog converter (DAC).

9. The signal oscillation circuit of claim 1, wherein the first signal converter comprises a variable current source.

10. The signal oscillation circuit of claim 1, wherein the VCO core is a complementary VCO core, wherein the VCO further comprises a second tail filter coupled to the complementary VCO core, wherein the second tail filter comprises a tunable component, and wherein the first output of the logic circuit is further coupled to a control input of the tunable component of the second tail filter.

11. The signal oscillation circuit of claim 1, wherein the VCO core is a complementary VCO core, wherein the VCO further comprises a second tail filter coupled to the complementary VCO core, wherein the second tail filter comprises a tunable component, and wherein a third output of the logic circuit is coupled to a control input of the tunable component of the second tail filter.

12. The signal oscillation circuit of claim 1, wherein the logic circuit comprises a digital signal generator including an output coupled to the input of the first signal converter.

13. The signal oscillation circuit of claim 12, wherein the digital signal generator is configured to output a digital square wave.

14. A signal oscillation circuit comprising:
   a voltage-controlled oscillator (VCO) that includes a VCO core and a tail filter coupled to the VCO core, the tail filter including a tunable component;
   a logic circuit including a first output coupled to a control input of the tunable component of the tail filter; and
   a signal converter including an input coupled to a second output of the logic circuit and including an output coupled to a node of the VCO, wherein the logic circuit comprises:
      a digital signal generator including an output coupled to the input of the signal converter; a delay element having an input coupled to the output of the digital signal generator;
      a correlator including a first input coupled to an input of the logic circuit and including a second input coupled to an output of the delay element;
      a first digital gain component including an input coupled to an output of the correlator and having a first gain;
      a second digital gain component including an input coupled to the output of the correlator and having a second gain different than the first gain;
      a multiplexer including a first input coupled to an output of the first digital gain component and including a second input coupled to an output of the second digital gain component; and an accumulator including an input coupled to an output of the multiplexer and including an output coupled to the first output of the logic circuit.

15. The signal oscillation circuit of claim 14, wherein the logic circuit further comprises a third digital gain component including an input coupled to the output of the digital signal generator and including an output coupled to the second output of the logic circuit.

16. A method of oscillating signal generation, the method comprising:

controlling an oscillating signal output by a voltage-controlled oscillator (VCO) using a tuning signal;

generating a training signal;

applying the training signal to a node of the VCO for upconversion by the VCO, wherein the training signal is different than the tuning signal;

determining a phase difference between a reference signal and a processed version of the oscillating signal; and based on the phase difference, tuning at least one tail filter of the VCO, wherein the tuning at least reduces an upconversion gain of the VCO and wherein the tuning comprises:

converting the phase difference to a digital representation of the phase difference;

delaying the training signal to generate a delayed training signal;

correlating the delayed training signal with the digital representation of the phase difference to generate a correlation; and tuning the at least one tail filter of the VCO based on the correlation.

17. The method of claim 16, wherein the training signal comprises a square wave current signal.

18. The method of claim 16, wherein generating the training signal comprises:

generating a digital training signal; and converting the digital training signal to an analog training signal for the applying.

19. The method of claim 18, wherein converting the phase difference to the digital representation of the phase difference comprises using a 1-bit analog-to-digital converter (ADC).

20. The method of claim 16, wherein the training signal comprises a current signal and wherein the applying comprises applying the current signal with a variable current source.

* * * * *